(12) United States Patent
Vinet et al.

(10) Patent No.: US 8,232,168 B2
(45) Date of Patent: *Jul. 31, 2012

(54) METHOD FOR MAKING ASYMMETRIC DOUBLE-GATE TRANSISTORS BY WHICH ASYMMETRIC AND SYMMETRIC DOUBLE-GATE TRANSISTORS CAN BE MADE ON THE SAME SUBSTRATE

(75) Inventors: Maud Vinet, Rives (FR); Olivier Thomas, Revel (FR); Olivier Rozeau, Moirans (FR); Thierry Poiroux, Voreppe (FR)

(73) Assignee: Commissariat a l'Energie Atomique, Paris (FR)

( * ) Notice: Subject to any disclaimer, the term of this patent is extended or adjusted under 35 U.S.C. 154(b) by 294 days.

This patent is subject to a terminal disclaimer.

(21) Appl. No.: 12/521,311

(22) PCT Filed: Dec. 28, 2007

(86) PCT No.: PCT/EP2007/064632
§ 371 (c)(1),
(2), (4) Date: Dec. 3, 2009

(87) PCT Pub. No.: WO2008/080982
PCT Pub. Date: Jul. 10, 2008

(65) Prior Publication Data
US 2010/0317167 A1     Dec. 16, 2010

(30) Foreign Application Priority Data
Dec. 28, 2006   (FR) ...................................... 06 56010

(51) Int. Cl.
*H01L 21/336* (2006.01)

(52) U.S. Cl. .................. 438/283; 257/E21.421; 438/286

(58) Field of Classification Search .................. 438/283, 438/284, 286, 287; 257/E21.421
See application file for complete search history.

(56) References Cited

U.S. PATENT DOCUMENTS
6,442,060 B1   8/2002   Leung et al.
(Continued)

FOREIGN PATENT DOCUMENTS
EP   0 457 434   11/1991
(Continued)

OTHER PUBLICATIONS

Takeuchi, Kiyoshi et al., "A Study of the Threshold Voltage Variation for Ultra-Small Bulk and SOI CMOS", IEEE Transactions on Electron Devices, vol. 48, No. 9, pp. 1995-2001, (Sep. 2001).

(Continued)

Primary Examiner — Savitr Mulpuri
(74) Attorney, Agent, or Firm — Oblon, Spivak, McClelland, Maier & Neustadt, L.L.P.

(57) ABSTRACT

A method for fabricating a microelectronic device with one or plural double-gate transistors, including: a) forming one or plural structures on a substrate including at least a first block configured to form a first gate of a double-gate transistor, and at least a second block configured to form the second gate of said double-gate, the first block and the second block being located on opposite sides of at least one semiconducting zone and separated from the semiconducting zone by a first gate dielectric zone and a second gate dielectric zone respectively, and b) doping at least one or plural semiconducting zones in the second block of at least one given structure among the structures, using at least one implantation selective relative to the first block, the second block being covered by a hard mask, a critical dimension of the hard mask being larger than the critical dimension of the second block.

16 Claims, 10 Drawing Sheets

U.S. PATENT DOCUMENTS

| | | | |
|---|---|---|---|
| 6,731,533 | B2 | 5/2004 | Deng et al. |
| 7,348,225 | B2 * | 3/2008 | Zhu ............................ 438/157 |
| 7,511,989 | B2 | 3/2009 | Thomas et al. |
| 7,538,000 | B2 * | 5/2009 | Dao ............................ 438/287 |
| 8,116,118 | B2 * | 2/2012 | Thomas et al. ............. 365/154 |
| 2004/0197977 | A1 | 10/2004 | Deleonibus |
| 2005/0017377 | A1 | 1/2005 | Joshi et al. |
| 2005/0110079 | A1 | 5/2005 | Nowak |
| 2005/0169090 | A1 | 8/2005 | Shau |
| 2005/0199964 | A1 | 9/2005 | Sekigawa et al. |
| 2005/0218427 | A1 | 10/2005 | Joshi et al. |
| 2006/0274569 | A1 | 12/2006 | Joshi et al. |
| 2007/0189060 | A1 | 8/2007 | Inaba |
| 2009/0079004 | A1 * | 3/2009 | Licitra et al. ............... 257/365 |
| 2010/0096700 | A1 * | 4/2010 | Vinet et al. ................. 257/365 |
| 2010/0178743 | A1 * | 7/2010 | Vinet et al. ................. 438/283 |
| 2010/0320541 | A1 * | 12/2010 | Vinet et al. ................. 257/365 |

FOREIGN PATENT DOCUMENTS

| | | |
|---|---|---|
| EP | 1 465 200 | 10/2004 |
| WO | 03 021633 | 3/2003 |

OTHER PUBLICATIONS

Kedzierski, Jakub et al., "High-performance symmetric-gate and CMOS-compatible $V_t$ asymmetric-gate FinFET devices", International Electron Devices Meeting, pp. 437-440, (2001).

Ilicali, G. et al., "Planar Double Gate Transistors with Asymmetric Independent Gates", IEEE International SOI Conference, pp. 126-127, (2005).

Lu, Ching-Huang et al., "Characteristics and Mechanism of Tunable Work Function Gate Electrodes Using a Bilayer Metal Structure on $SiO_2$ and $HfO_2$", IEEE Electron Device Letters, vol. 26, No. 7, pp. 445-447, (Jul. 2005).

Mathew, L. et al., "Multiple Independent Gate Field Effect Transistor (MIGFET)—Multi-Fin RF Mixer Architecture, Three Independent Gates (MIGFET-T) Operation and Temperature Characteristics", Symposium on VLSI Technology Digest of Technical Papers, pp. 200-201, (2005).

Ananthan, Hari et al., "FinFET SRAM—Device and Circuit Design Considerations", Quality Electronic Design, IEEE Computer Society, pp. 511-516, (Mar. 22, 2004).

Maegawa, Shigeto et al., "A 0.4 µm Gate-All-Around TFT (GAT) Using a Dumy Nitride Pattern for High-Density Memories", Jpn. J. Appl. Phys., vol. 34, No. 2B, Part 1, pp. 895-899, (Feb. 1, 1995).

Agarwal, Amit et al "DRG-Cache: A Data Retention Gated-Ground Cache for Low Power[1]", DAC, pp. 473-478, (Jun. 2002).

Azizi, Navid et al., "Low-Leakage Asymmetric-Cell SRAM", IEEE Transactions on Very Large Scale Integration (VLSI) Systems, vol. 11, No. 4, (pp. 701-715, (Aug. 2003).

Flautner, Krisztian et al., "Drowsy caches: Simple Techniques for Reducing Leakage Power", Proceedings of the $29^{th}$ Annual International Symposium on Compter Architecture (ISCA'02), IEEE Computer Society, 10 Pages, (2002).

Mathew, L. et al., "CMOS Vertical Multiple Independent Gate Field Effect Transistor (MIGFET)", IEEE International SOI Conference, pp. 187-189, (Oct. 2004).

Takeda, Koichi et al., "A 16-Mb 400-MHz Loadless CMOS Four-Transistor SRAM Macro", IEEE Journal of Solid-State Circuits, vol. 35, No. 11, pp. 1631-1640, (Nov. 2000).

Osada, Kenichi et al., "16.7-fA/Cell Tunnel-Leakage-Suppressed 16-Mb SRAM for Handling Cosmic-Ray-Induced Multierrors", IEEE Journal of Solid-State Circuits, vol. 38, No. 11, pp. 1952-1957, (Nov. 2003).

Seevinck, Evert et al., "Static-Noise Margin Analysis of Mos SRAM Cells", IEEE Journal of Solid-State Circuits, vol. sc-22, No. 5, pp. 748-754, (Oct. 1987).

Vinet, M. et al., "Planar Double Gate CMOS transistors with 40nm metal gate for multipurpose applications", SSDM, 2 Pages, (2004).

Yamaoka, Masanao et al., "Low Power SRAM Menu for SOC Application Using Yin-Yang-Feedback Memory Cell Technology", Symposium on VLSI Circuits, Digest of Technical Papers, 4 Pages, (Jun. 2004).

Kim, Jae-Joon et al., "Back-Gate Controlled READ SRAM with Improved Stability", IEEE International SOI Conference, pp. 211-212, (2005).

U.S. Appl. No. 12/866,821, filed Aug. 9, 2010, Thomas, et al.

* cited by examiner

METHOD FOR MAKING ASYMMETRIC DOUBLE-GATE TRANSISTORS BY WHICH ASYMMETRIC AND SYMMETRIC DOUBLE-GATE TRANSISTORS CAN BE MADE ON THE SAME SUBSTRATE

TECHNICAL FIELD

The invention relates to the field of microelectronic devices equipped with double-gate transistors and relates to an improved process for making asymmetric double-gate transistors.

The invention also relates to a process for making a microelectronic device provided with one or several symmetric double-gate transistors and one or several asymmetric double-gate transistors co-integrated on the same substrate.

The invention is also applicable to the field of random access memories such as SRAM (Static Random Access Memory).

PRIOR ART

It is known how to make double-gate transistors with two independent gates that have symmetric electrical characteristics or identical behaviour for the same polarisation. A double-gate transistor is a transistor that comprises independent first and second gates formed on each side of an active zone, the first gate and the second gate being connected or not connected to each other.

Double-gate transistors may be made using a so-called "planar" structure, formed from a first gate and a second gate arranged such that the first gate, a semiconducting zone that is intended to form one or several channels, and the second gate are superposed on a substrate.

Double-gate transistors may also be made using a so-called "finFET" type structure. In this type of transistor, the double-gate is formed from a first gate and a second gate arranged such that the first gate, a semiconducting zone that is intended to form one or several channels, and the second gate are placed adjacent to each other on a substrate.

It is also known how to make asymmetric double-gate transistors. An asymmetric double-gate is formed from two separate gates that are dissymmetric about the principal plane of a semiconducting zone that is intended to form one or several channels, and these gates are placed on each side of this semiconducting zone.

So-called "non self-aligned" processes have been developed to make asymmetric transistors with planar structure, in other words transistors for which each gate is defined by a different lithography.

Document [ILL05] discloses an example embodiment of an asymmetric double-gate transistor using a non self-aligned process.

FIGS. 1A-1E show different examples of making an asymmetric planar double-gate structure.

One solution for making asymmetric transistors using a non self-aligned technology consists of forming a first gate or back gate intentionally offset from the second gate or front gate, and/or with a smaller critical dimension than the dimension of front gate.

FIG. 1A shows an example of a structure of an asymmetric planar double-gate transistor. This structure is provided with a first gate 10 or back gate in contact with a first gate dielectric layer 11, and a second gate 14 formed on a second gate dielectric layer 13, a semiconducting active zone 12 that is intended to form one or several channels being located between the first dielectric layer 11 and the second dielectric layer 13. The first gate 10 and the second gate 14 are offset such that part of the first gate 10 is not facing the second gate 14 and part of the second gate 14 is not facing the first gate 10. In this example the offset $\Delta$ between the two gates 10 and 14 is such that $\Delta = D1$ for example where D1 is of the order of 30 nanometres.

Another example of dissymmetry is shown in FIG. 1B. In this figure an asymmetric planar double-gate transistor is provided with a first gate 20 formed below a semiconducting active zone 12 and facing a second gate 24 with a critical dimension less than the dimension of first gate, and formed above said semiconducting active zone 12. The second gate 24 and the first gate 20 are offset such that the second gate 24 is entirely facing the first gate 20, while part of the second gate 24 is facing the semiconducting active zone 12 but is not facing the second gate 24. In this example the offset $\Delta$ between the two gates 20, 24 is such that $\Delta = +D2$ for example where D2 is of the order of 15 nanometres.

FIG. 1C shows another example of a structure of an asymmetric planar double-gate transistor. This structure is provided with a first gate 30 or lower gate with a critical dimension $dc_1$, and a second gate 34 or upper gate with a critical dimension $dc_2$ greater than $dc_1$.

FIG. 1D shows another example of a structure of an asymmetric planar double-gate transistor. This structure is provided with a first gate 40 or lower gate with a given critical dimension, and a second gate 44 or upper gate with a larger critical dimension. The offset $\Delta$ between the two gates is such that $\Delta = -D1$.

FIG. 1E shows another example of a structure of an asymmetric planar double-gate transistor. This structure is provided with a first gate 50 or lower gate with a critical dimension $dc_1$, and a second gate 54 or upper gate, the offset $\Delta$ between the two gates being such that $\Delta = -D2$.

The leakage current $I_{off}$ of the transistor can be adjusted by adjusting the offset $\Delta$ between the two gates of an asymmetric double-gate.

In FIG. 2, the curves $C_{11}$ and $C_{12}$ represent simulations and measurements respectively of a leakage current $I_{off}$ from an asymmetric double-gate structure as a function of the offset $\Delta$ between its lower and upper gates. Each of the gates has a critical dimension of the order of 70 nanometres, while the channel thickness is of the order of 10 nanometres.

It is difficult to obtain a precise offset $\Delta$ between the gates with processes that are not self-aligned. A controlled and very small offset $\Delta$, for example of the order of 2 to 5 nanometres, is required for some applications.

The lack of precision of "non self-aligned" production processes also causes a problem for implementing symmetric double-gate transistors. The results currently obtained with such processes show that it is difficult to obtain two gates with the same length and that are well aligned. In particular, this deteriorates dynamic operation of transistors made using such a process.

Self-aligned production processes, in other words processes in which the two gates are defined by the same lithography step, have been developed to make it possible to benefit from the intrinsic advantages of planar double-gate structures. For example, document [DEL01] describes such a process.

The problem of finding a new process for making asymmetric double-gate transistors then arises.

Presentation of the Invention

The invention relates to a process for making a microelectronic device with one or several double-gate transistors, comprising the following steps:

a) formation of one or several structures on a substrate comprising at least one first block, that will form a first gate of a double-gate transistor, and at least a second block that will form the second gate of said double-gate, the first block and the second block being located on opposite sides of at least one semiconducting zone and separated from the semiconducting zone by a first gate dielectric zone and a second gate dielectric zone, respectively, b) doping at least one or several semiconducting zones of the second block of at least one given structure among said structures, the second block being covered by a hard mask, the critical dimension of the hard mask being larger than the critical dimension of the second block, using at least one implantation step selective with respect to the first block. In this way, the hard mask can form means of protecting the upper part of the second block from the implantation.

Selective implantation means that the first block is not implanted, or is less implanted than the second block.

Such an implantation step can be used to make asymmetric double-gates.

The first implantation may be done at a predetermined non-zero angle from a normal to the principal plane of the substrate passing through the semiconducting zone.

According to one possibility, said implantation can be done in zones in the second block located close to and/or in contact with the second dielectric zone.

According to one particular embodiment, said implantation may be done on a first side of the structure, the part of the structure on the other side of a normal to the principal plane of the substrate passing through the semiconducting zone not being implanted.

The process may include at least one selective etching step c) between non-implanted semiconducting zones of said blocks and implanted semiconducting zones of the second block, after step b).

This makes it possible to make asymmetric double-gates with different critical dimensions.

Selective etching may be selective between non-doped semiconducting zones and semiconducting zones doped using said implantation.

According to one variant, selective etching may be selective between semiconducting zones doped using a given type of doping and semiconducting zones doped by said implantation using another type of doping different from the given type of doping.

The structures may be so-called "planar" structures such that the first block is supported on the substrate, the first block, the semiconducting zone and the second block being superposed on top of said substrate.

The structures may be made in step a) such that the critical dimension of the first block and the second block is less then the critical dimension of the second and/or the first dielectric zone.

In this way, the second dielectric zone can form means of protecting the second block from the implantation.

According to one possible embodiment of the structure, the first block and/or the second block may be based on a semiconducting material.

According to one variant, the first block and/or the second block may be formed from at least one metallic layer and at least one stacked semiconducting layer respectively.

The process according to the invention can be used to make asymmetric and symmetric double-gate transistors on the same substrate.

In this case, in step b), at least one particular structure among said structures formed in step a) is protected during the doping step done in step b), by means of at least one protection layer, for example based on resin or a hard mask layer based on a dielectric material for example such as $SiO_2$ or $Si_3N_4$, said particular structure being designed to form a symmetric double-gate transistor.

The first and the second block of this particular structure can be etched at the same time as the first and the second block of said given structure, said given structure being designed to form an asymmetric double-gate transistor, while the particular structure is designed to form a symmetric double-gate transistor.

The invention also relates to a process for making a structure of a random access memory cell provided with asymmetric double-gate transistors comprising a process like that defined above.

The invention also relates to a process for making a structure of a random access memory cell provided with asymmetric double-gate transistors and symmetric double-gate transistors using a process like that described above.

The memory can be a static random access memory SRAM.

BRIEF DESCRIPTION OF THE DRAWINGS

This invention will be better understood after reading the description of example embodiments given purely for information and being in no way limitative, with reference to the appended drawings in which.

DETAILED PRESENTATION OF PARTICULAR EMBODIMENTS

We will now describe a detailed example of a process for making an asymmetric planar double-gate structure formed from two gates with different critical sizes or dimensions, with reference to FIGS. 3A to 3E.

Figure 1A:
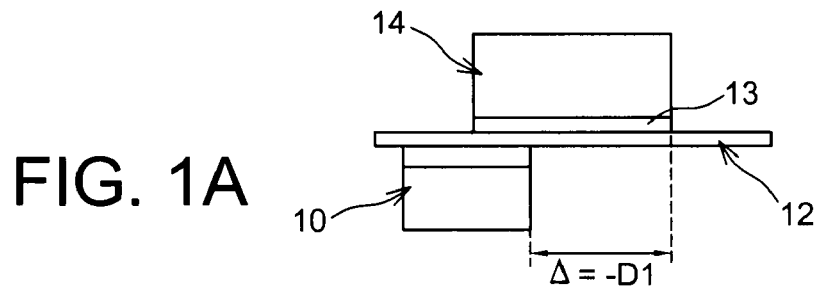
FIGS. 1A-1E show different embodiments of an asymmetric planar double-gate.
Figure 1B:
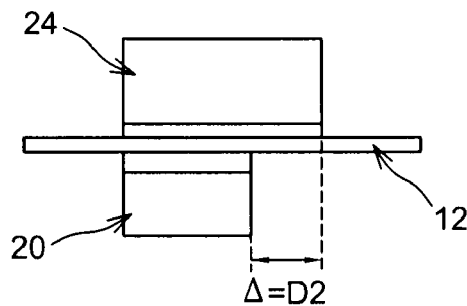
Figure 1C:
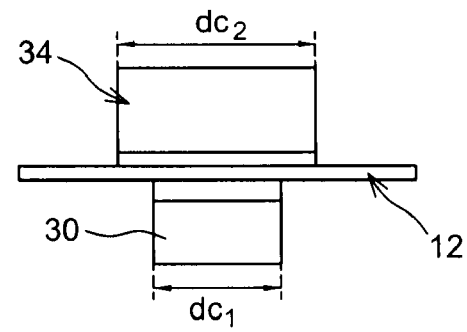
Figure 1D:
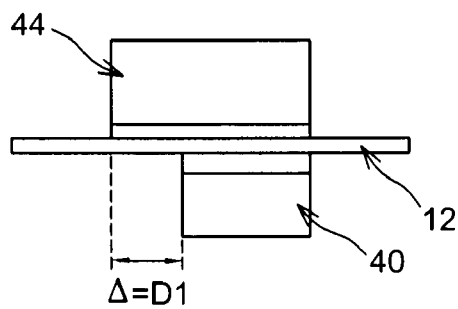
Figure 1E:
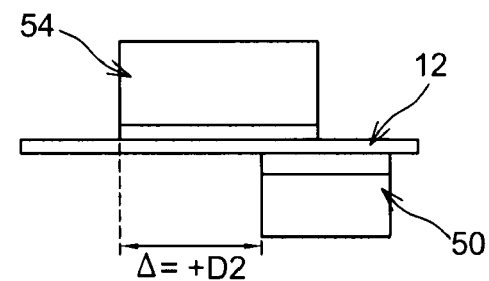
Figure 2:
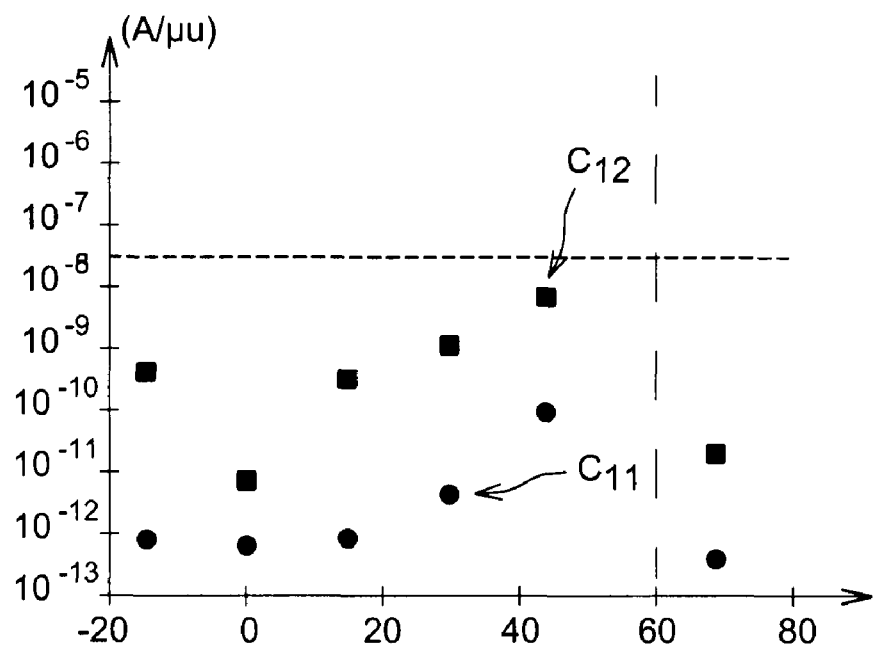
FIG. 2 shows examples of curves for the simulation and measurement of a leakage current from an asymmetric double-gate structure as a function of the offset between its two gates.
Figure 3A:
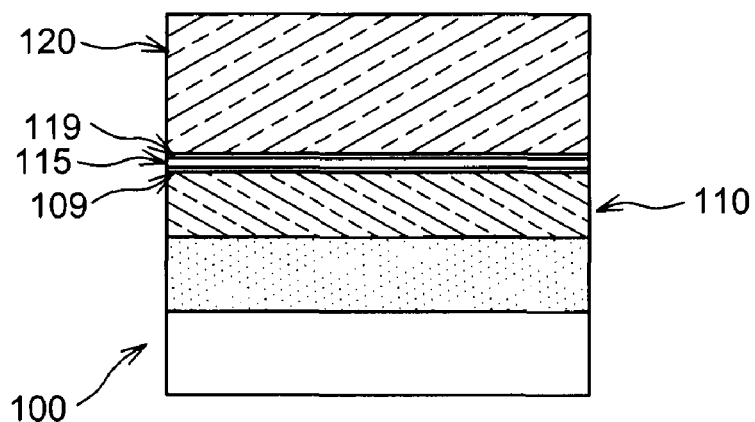
FIGS. 3A-3E show an example process according to the invention for making an asymmetric planar double-gate.
Figure 3B:
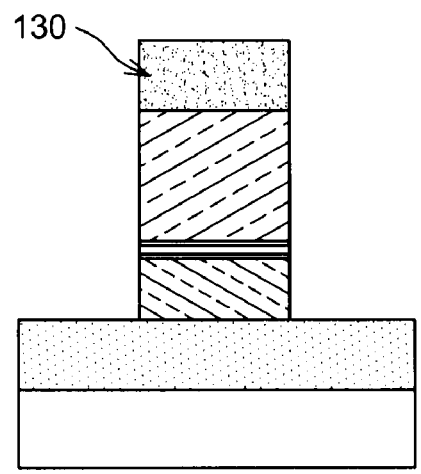
Figure 3C:
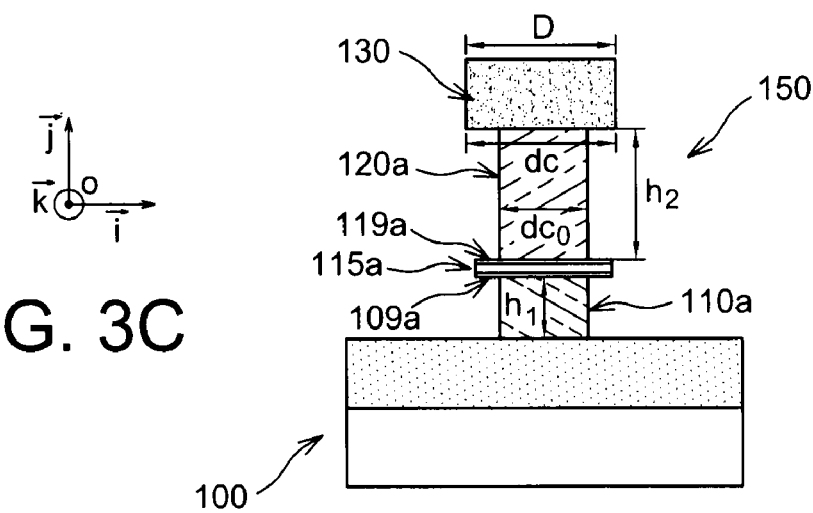

The first step is to make a structure 150 formed from a stack like that shown in FIG. 3C comprising a first gate block 110a, a first gate dielectric zone 109a supported on the first block 110a, a semiconducting zone 115a supported on the first dielectric zone 109a, a second gate dielectric zone 119a supported on the semiconducting zone 115a, a second gate block 120a supported on the second dielectric zone 119a, on a substrate 100. The second gate block 120a may be based on a semiconducting material for example such as polysilicone that could be doped, while the first gate block 110a may also be based on a semiconducting material for example such as polysilicone that could be doped. In this example, the dielectric zones 109a and 119a and the semiconducting zone 120a are made with a critical size or dimension dc larger than the critical size or dimension $dc_0$ of the first gate block 110a and the second gate block 120a (the critical dimensions $dc_0$ and dc being defined in a direction parallel to the vector $\vec{i}$ in the orthogonal coordinate system [O; $\vec{i}$; $\vec{j}$; $\vec{k}$] in FIG. 3C). A hard mask 130 based on a dielectric material, for example such as $SiO_2$ or $Si_3N_4$, may be mounted on the second gate block 120a.

Such a structure 150 was made starting from a stack of thin layers made on a substrate 100, for example a semiconductor on insulator type substrate, said stack being formed from at least one first layer 110 of gate material, at least one layer 109 of dielectric material on the layer 110 of gate material, at least one semiconducting layer 115 on the dielectric layer 109, and at least one second layer 120 of gate material on the semiconducting layer 115. The layers 110 and 120 of the gate material may for example be formed based on polysilicone. The thickness of the first layer 110 of gate material may for example be between 10 nanometres and 100 nanometres, while the thickness of the second layer 120 of the gate material may be greater, for example between 5 nanometres and 50 nanometres (FIG. 3A).

The stack may then have been etched, for example by anisotropic etching, through the hard mask 130, so as to form the first gate block, the first dielectric zone, the semiconducting zone, the second dielectric zone and the second gate block, to make the structure 150. For example, the stack may be etched by anisotropic plasma etching based on HBr and oxygen (FIG. 3B).

A second etching may have been done, selective with respect to the semiconducting zone and dielectric zones, to reduce the lateral dimensions of the first and second gate blocks 110a and 120a. The second etching may for example be an isotropic plasma etching based on $CF_4$ (FIG. 3C).

The next step after obtaining the structure 150 (FIG. 3D) is to dope the second block 120a using at least a first implantation selective with respect to the first block 110a. Selective implantation means that an implantation of the second block 120a is done without implanting the first block 110a or implanting the first block 110a less. In this example, the implantation is done such that the first block 110a is not implanted close to the interface with the first dielectric zone 109a or in a zone adjacent to the first dielectric zone 109a.

The selective implantation may be done so as to obtain implanted zones 121a and 122a in the second block 120a, particularly in the regions of the second block 120a located on the flanks of this block and adjacent to the second dielectric zone 119a, while the first block is not implanted or is not implanted at least in the zone in the first block 110a located adjacent to the first dielectric zone 120a.

Figure 3D:
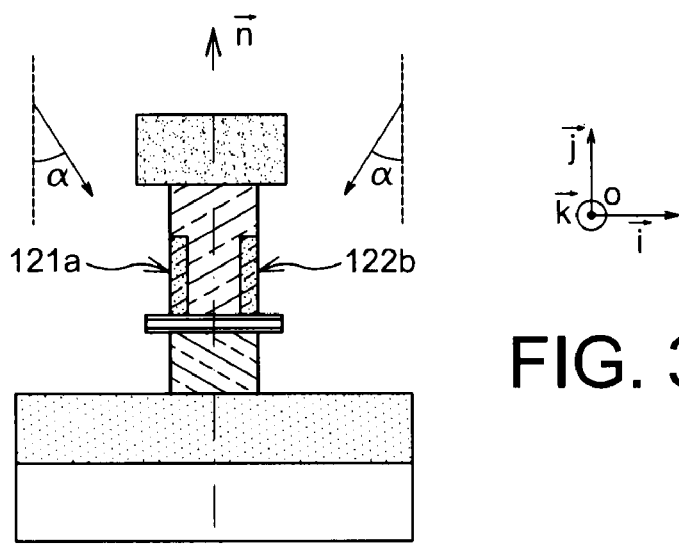

In this example, the implantation is inclined at a predetermined angle $\alpha$ with respect to a normal to the principal plane of the substrate 100 (the principal plane of the substrate being defined in FIG. 3D as being a plane passing through the substrate and parallel to the plane [O; $\vec{i}$; $\vec{k}$]). The implantation angle $\alpha$ may for example be between 7° and 45°. The critical dimension dc of the dielectric zones 109a, 119a, the corresponding heights $h_1$ and $h_2$ of the first gate block 110a and the second gate block 120a, and the implantation angle $\alpha$ may be selected so that the second gate block 120a is doped, preferably without doping the first block 110a. In order to implement this selective implantation, the structure 150 may be made such that the critical dimension dc of the first block 110a and the second block 120a is less than the critical dimension denoted $dc_0$ of zones 109 and 119 of the gate dielectric and the semiconducting zone 115. The critical dimensions dc and $dc_0$ may be such that $dc_0-dc=l_2$, in which for example $l_2$ is between 5 and 25 nanometres. Since the critical dimension of dielectric zones 109a, 119a is larger than the critical dimension of blocks 110a and 120a, zones 119a and 109a may provide protection for the first block during the inclined implantation, such that this first block is not implanted, or is not implanted close to the interface with the first dielectric 109a. The dielectric zones 109a, 119a thus form an implantation mask for the first block 110a. In order to implement this selective implantation, the blocks 110a and 120a may be designed such that the height $h_2$ of the second block 120a is greater than the height $h_1$ of the first gate block 110a (the heights $h_1$ and $h_2$ being dimensions defined in a direction parallel to the vector $\vec{j}$ in an orthogonal coordinate system [O; $\vec{i}$; $\vec{j}$; $\vec{k}$] in FIG. 3C). The height $h_2$ of the second block 120a may be chosen such that $h_2$ is less than or equal to $(dc-dco)/\tan \alpha$. The height $h_2$ of the second block 120a may for example be between 5 nanometres and 50 nanometres. The height $h_1$ of the first block 110a may for example be between 10 nanometres and 100 nanometres.

The critical dimension D of the hard mask may be chosen to be greater than the critical dimension of the second block 120a, so as to protect the upper part of this block during implantation. The critical dimension D of the hard mask may be such that $D-dc=l_1$, for example where $l_1$ is less than 30 nanometres. In this example, the implantation is a local implantation on the second block 120a made on each side of the structure 150, in semiconducting zones located on the flanks of this second block 120a and close to and/or in contact with the gate dielectric zone 109.

Doping by implantation is a predetermined type of doping, or it may be done with a predetermined species. In the case in which blocks 110a and 120a are based on polysilicone, it would for example be possible to do an N type doping with arsenic, for example at a dose of $3^{15}$ atoms.$cm^{-2}$ and an energy chosen as a function of the difference in the critical size or dimension required between the two gates. For example, it would be possible to use arsenic or phosphorus or antimony to implant a semiconducting block 120a at 3 keV, for example formed from polysilicone P doped with a doping agent such as boron at an average level of $10^{20}$ atoms.$cm^{-3}$, to obtain a controlled difference in the dimension of the order of 3 nanometres on each side of the gate. According to one variant, the implantation could be a polysilicone implantation made with germanium.

The blocks 110a and 120a may have been doped before the selective implantation step, and for example may have been doped at the time that the semiconducting layers 110 and 120 were deposited. In this case, selective implantation of the second block 120a provides a means of modifying doping of the second block 120a, particularly in regions located at the flanks of the second block and in contact with the second dielectric zone 119a, while doping of the first block 120a is unchanged subsequent to said selective implantation, at least in a zone located in contact with the first dielectric zone 109a.

The next step is selective etching between semiconducting zones that were implanted and semiconducting zones that were not implanted during the previously described step.

According to one example, the selective etching may be selective removal of an implanted semiconducting material N in the case in which the semiconducting zones 121a and 122a were N implanted, relative to non implanted P doped zones.

The following table shows an example of a plasma etching process that can create selectivity between a semiconducting material implanted with N type doping and a P doped material:

|    | C12 | SF6 | Ps (W) | Pb (W) | P (mT) | t (s) |
|----|-----|-----|--------|--------|--------|-------|
| BT | 60  | —   | 750    | 150    | 30     | 5     |
| ME | 150 | —   | 1000   | 0      | 4      | 15    |
| OE | 150 | —   | 1000   | 0      | 70     | 30    |

In this table BT, ME, OE, denote Break Through, Main Etch, and Over Etch respectively.

With such a process, N doped zones, for example the semiconducting zones 121a and 122a of the first block, will be etched while the P doped zone will not be etched.

According to another example, the selective etching may be selective removal of a P or P+ implanted semiconducting material in the case in which the semiconducting zones 121a and 122a were P or P+ implanted, relative to non-implanted N doped zones.

According to another example, selective etching may be selective removal of an N+ implanted semiconducting material if the semiconducting zones 121a and 122a were N+ implanted, relative to non-implanted but P doped zones.

For example, selective etching with HNA (HF/HNO$_3$/CH$_3$COOH) can be done in the case in which the semiconducting zones 121a and 112a are based on polysilicone and were P+ implanted.

For example, selective etching with HNA (HF/HNO$_3$/CH$_3$COOH) may also be done in the case in which the semiconducting zones 121a and 122a are based on polysilicone and were N+ implanted.

According to another example, the selective etching may be selective removal of an implanted semiconducting material in the case in which the semiconducting zones 121a and 122a were doped by implantation, relative to semiconducting zones that were not implanted and were not doped. For example, selective etching with TMAH (tetra-methyl ammonium hydroxide) is possible in the case in which the semiconducting zones 121a and 122a are based on polysilicone and were implanted with N doping. In this case, non-doped zones are etched more quickly than the implanted zones 121a and 122a.

Figure 3E:
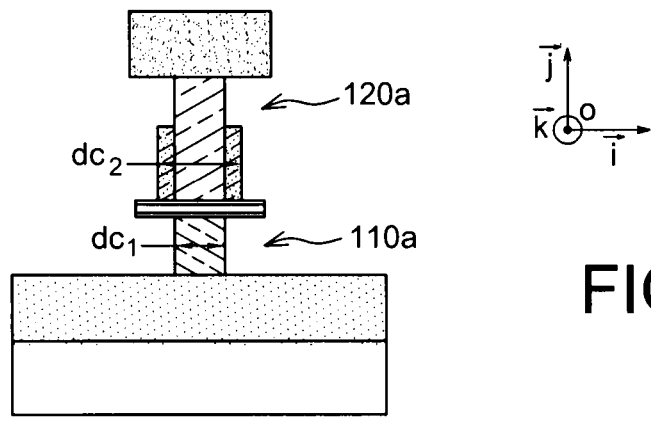

Such an example is illustrated in FIG. 3E. Once selective etching has been done, the critical dimension of the first block 110a that will form a first gate is $dc_1$, while the critical dimension of the second block 120b that will form a second gate is $dc_2$ greater than $dc_1$, the implanted semiconducting zones 121a and 122a being less etched than the non-implanted semiconducting zones.

In the case in which the first block and the second block are based on polysilicone, the implantation done previously may be a germanium implantation in the polysilicone, so as to use a selective etching process for polysilicone implanted with germanium, relative to polysilicone, for example using an isotropic plasma etching based on $CF_4$.

Implantations may have been done before the selective implantation step to define extensions to the source and drain zones.

According to one variant of the example process described above, the implantation can be done on only one side of the structure 150 during the selective implantation step described above.

Figure 4A:
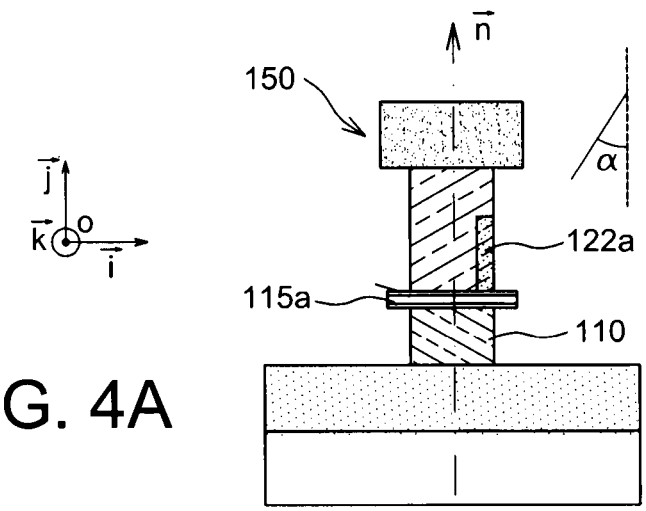
FIGS. 4A-4B show variant of the example process according to the invention for making an asymmetric planar double-gate.

In FIG. 4A, a semiconducting zone 122a is implanted on a flank of the second block 120 in contact with the gate dielectric 119, while the second block on the other side of a normal to the principal plane of the substrate 100 passing through the structure 150 is not implanted. The critical dimension D of the hard mask may be chosen to be greater than the critical dimension of the second block 120a, so as to protect the upper part of this block during implantation.

Figure 4B:
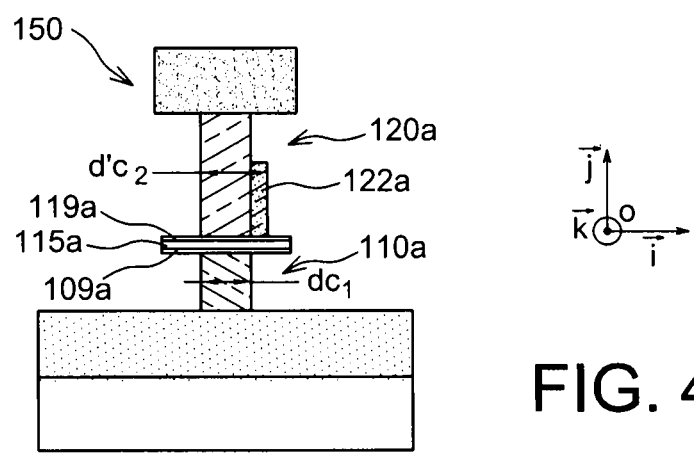

Once the selective etching of the gate structure has been made, the critical dimension of first block 110a that will form a first gate is $dc_1$, while the critical dimension of the second block 120b that will form a second gate is $d'c_2$ greater than $dc_1$ (FIG. 4B). Another variant of one of the processes described above includes the production of an asymmetric double-gate structure provided with two gates with different compositions, and designed to have different output work done on them.

In this case, blocks 110a and 120a may for example be formed from a bilayer. The first block 110a may for example be formed from a metallic layer for example based on TiN or TaN in contact with the first dielectric zone 109 and a layer of semiconducting material, for example based on polysilicone, on which the metallic layer is supported. The second block 120a may also be formed from a bilayer comprising a metallic layer, for example based on TiN or TaN in contact with the second dielectric zone 119 and a layer of semiconducting material, for example based on polysilicone, supported on the metallic layer. The next step during selective implantation of the second block 120a is to implant the semiconducting layer of the bilayer. The output work from the polysilicone semiconducting layer/metallic layer bilayer can be transferred to the semiconducting layer based on polysilicone. The implantation energy and the implantation annealing are adjusted such that the implantation reaches the centre of the gate so that the output work is adjusted over the entire surface area of the gate. Thus, asymmetric operating transistors can be made, for example with a gate length of the order of 20 nm, and a threshold voltage Vth1 for the first gate adjusted for example to 0.1 Volts, and a threshold voltage Vth2 for the second gate for example adjusted to 0.3 Volts giving a difference in the output work between the two gates for example of the order of 0.4 Volts. The critical dimension D of the hard mask may be chosen to be greater than the critical dimension of the second block 120a, so as to protect the upper part of this block during implantation.

Either of the processes described above can be used for production or co-integration of asymmetric planar double-gate transistors and symmetric planar transistors on the same support or on the same substrate 100.

This is done by making several structures on a substrate such as the substrate 100, for example a first structure 250 and a second structure 260 of the same type as the structure 150 previously described. Means of protection against an ionic implantation beam are made for the second structure 260, before carrying out the selective implantation step. These protection means may be formed from at least one layer 270 for example defined by photolithography and covering the second structure 260. For example, the protection layer 270 may be formed from a resin based layer or a hard mask, for example based on $Si_3N_4$ or $SiO_2$. The protection layer 270 comprises at least one opening exposing the first structure 250.

Figure 5A:
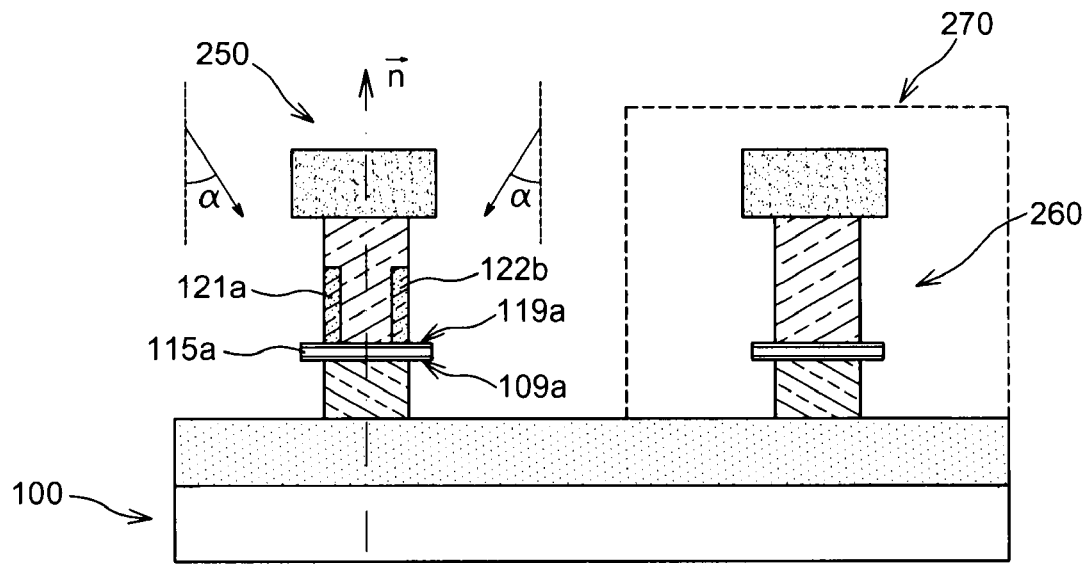
FIGS. 5A-5B show an example process for making an asymmetric double-gate structure and a symmetric double-gate structure on the same substrate.

The second gate block of the first structure 250 is then implanted selectively (FIG. 5A), for example using the process described above with reference to FIG. 3D. The layer 270 protects the second structure 260 from the particle beam during this implantation.

The protection layer 270 is then removed, for example using $O_2$ plasma followed by chemical etching based on a mix of sulphuric acid and oxygenated water when this protection layer is based on resin.

The next step is to etch gate blocks of the first structure 250 and the second structure 260. This etching is selective etching of the implanted semiconducting zones 121a, 122a relative to the semiconducting zones that have not been implanted.

Figure 5B:
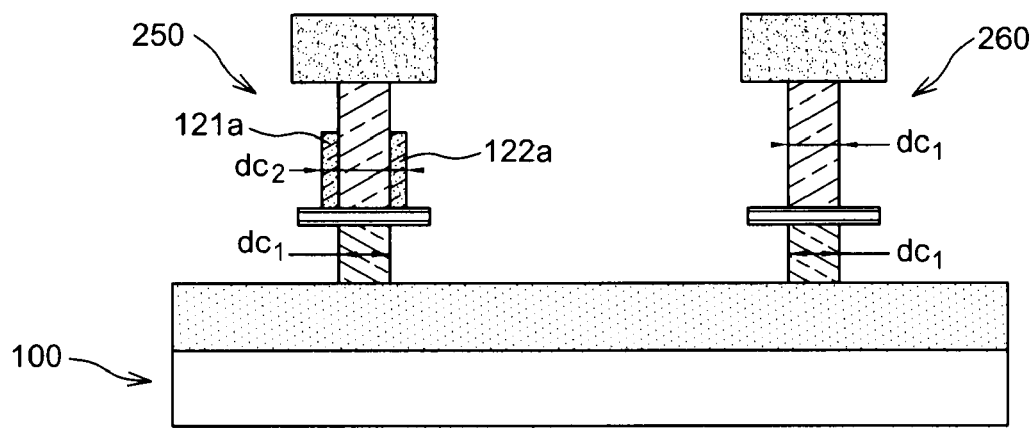

The first structure 250 and the second structure 260 supported on the substrate 100 are shown in FIG. 5B, once the etching has been done. The first structure 250 comprises a first block 110a of a gate with critical dimension $dc_1$, and a second block 120a that will form a second gate with critical dimension $dc_2$, the implanted semiconducting zones 121a, 122a having been etched less than the non-implanted semiconducting zones. Once the selective etching has been done, the second structure 260 comprises a first block 210a that will form a first gate with a critical dimension $dc_1$, while the second block 220b that will form a second gate has a critical dimension $dc_1$ identical to the first block. The first structure 250 is designed for an asymmetric double-gate transistor, while the second structure 260 made on the same substrate 100 as the first, is designed for a symmetric double-gate transistor. Steps to make spacers, to form source and drain regions and to make contacts may then be done to complete the formation of symmetric double-gate and asymmetric double-gate transistors.

Figure 6A:
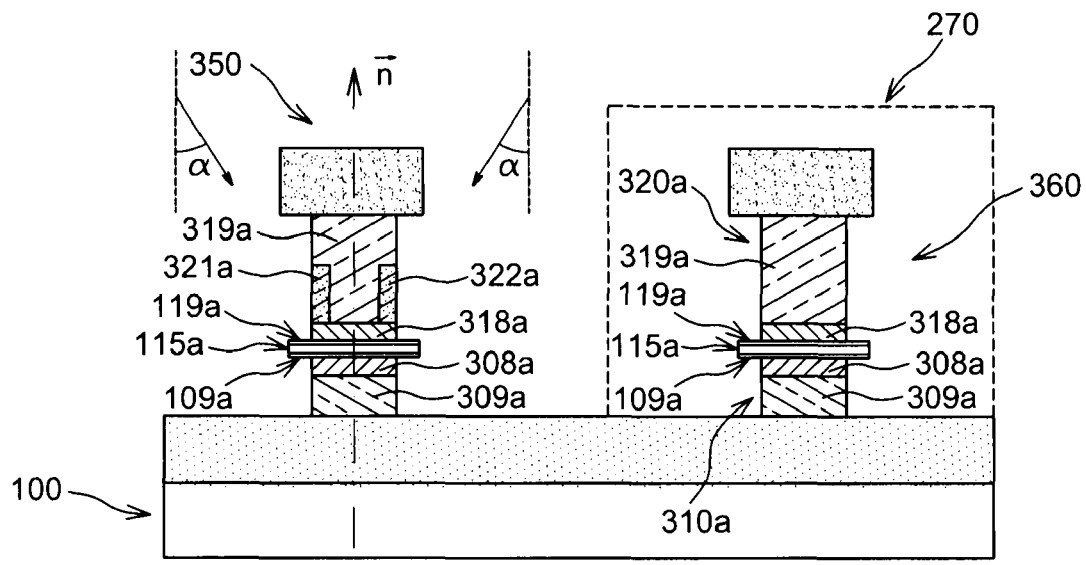
FIGS. 6A-6B show another example process for making an asymmetric double-gate structure and a symmetric double-gate structure on the same substrate.
Figure 6B:
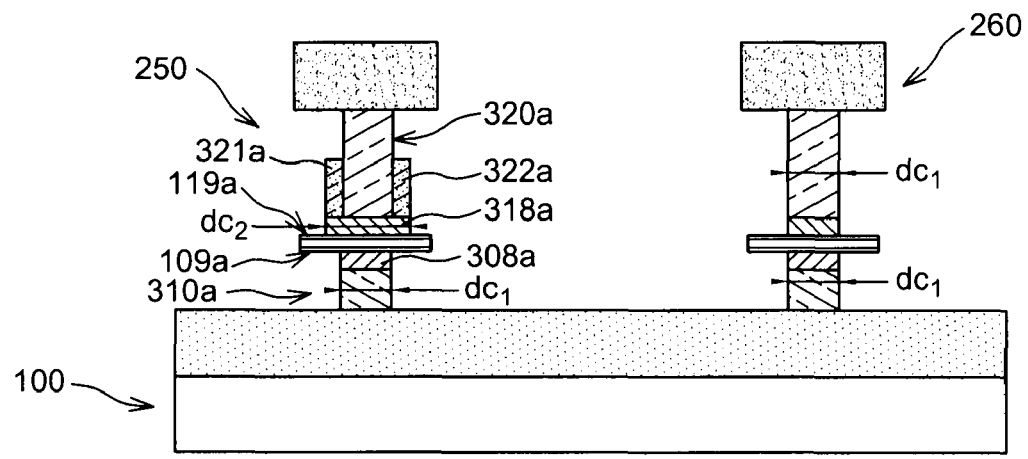

A variant of the process described above with reference to FIGS. 5A-5B is given with reference to FIGS. 6A-6B. For this variant, a first structure 350 and a second structure 360 of the same type as structures 250, 260 described above, are made on the substrate 100, but comprise blocks 310a, 320a respectively formed from a bilayer, instead of the semiconducting blocks 110a and 120a.

The first block 310a may for example be formed from a metallic layer 308a, for example based on TiN or TaN in contact with the first dielectric zone 109 and a layer of semiconducting material 309a for example based on polysilicone, on which the metallic layer 308a is supported. The second block 320a may also be formed from a bilayer comprising a metallic layer 318a, for example based on TiN or TaN in contact with the second dielectric zone 119a and a layer of semiconducting material 319a, for example based on polysilicone, supported on the metallic layer 318a.

In the same way as for the process described above with reference to FIG. 5A, a selective implantation of the second block 320a of the first structure 350 (FIG. 6A) is done, particularly so as to obtain strongly doped semiconducting zones 321a and 322a in the layer of the semiconducting material 309a of the first structure 350. During this implantation, the second structure 360 is protected by a protection layer 270, for example based on resin (FIG. 6A).

Then, the next step after removing the protection layer 270 is to selectively etch the semiconducting layers 309a and 319a of the bilayer with respect to the doped semiconducting zones 321a and 322a of the first structure 350. This etching may be isotropic and may for example be done using $CF_4$ based plasma.

The metallic layers 308a and 318a are then etched for example by chemical etching based on HCl and de $H_2O_2$. During this step, the polysilicone parts of the layers 309a and 319a are used as a mask for chemical etching (FIG. 6B).

The first structure 350 and the second structure 360 supported on the substrate 100 are shown in FIG. 6B, once the etching has been done. The first structure 350 comprises a first block 310a with a given contact surface area with the first dielectric zone 109a, while said second block 320a has a larger contact surface area with the second dielectric zone 119a than said given surface area. In the first structure 350, the critical dimension of the metallic layer 318a of the second block 320a in contact with the second dielectric zone 119a is equal to dc2, while the critical dimension of the metallic layer 308a of the first block 310a in contact with the first dielectric zone 109a is dc1, less than dc2.

Once the selective etching has been done, the second structure 360 comprises a first block that will form a first gate with a critical dimension $dc_1$, while the second block 320a that will form a second gate has a critical dimension $dc_1$, identical to the critical dimension of the first block. The first structure 350 is designed for an asymmetric double-gate transistor, while the second structure 360 made on the same substrate 100 as the first, is designed for a symmetric double-gate transistor.

A process like that described above with reference to FIGS. 3A-3E may be used to implement a random access memory cell provided with asymmetric double-gate transistors. A cell provided with asymmetric double-gate transistors only can be made using such a process.

According to another possibility, a cell provided with asymmetric double-gate transistors and symmetric double-gate transistors co-integrated on the same support may be made, for example using a process like that described above with reference to FIGS. 5A-5B.

Figure 7:
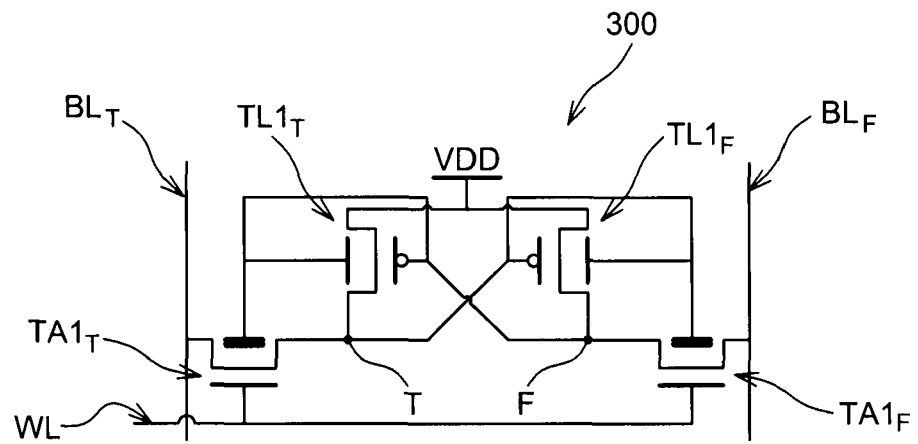
FIG. 7 shows an example of a 4T memory cell, provided with 4 asymmetric double-gate transistors that can be implemented using a process according to the invention.

FIG. 7 shows an example of a random access memory cell 300 provided with asymmetric double-gate transistors implemented using a process for example like that described above with reference to FIGS. 3A-3E.

This memory cell 300 is a 4T type SRAM static memory cell provided with 4 double-gate transistors, for example made using the MOS technology. The cell 300 comprises a first plurality of transistors forming a first inverter and a second inverter connected according to a "flip-flop" configuration. The first plurality of transistors may be formed from a first asymmetric double-gate charge transistor $TL1_T$, and a second asymmetric double-gate charge transistor $TL1_F$. The charge transistors $TL1_T$ and $TL1_F$ may be made using a given first type of MOS technology, for example a PMOS type technology. The two gates of the first charge transistor $TL1_T$ are connected to each other, while the two gates of the second charge transistor $TL1_F$ are also connected to each other. The double-gate of the second charge transistor $TL1_F$ is also connected to a first storage node T of the first cell 300, while the double-gate of the first charge transistor $TL1_T$ is also connected to a second storage node F of the first cell 300. The sources of the charge transistors $TL1_T$, $TL1_F$, may be connected to each other and to a power supply potential VDD, while the drain of the first charge transistor $TL1_T$ may be connected to the first node T and the drain of the second charge transistor $TL1_F$ is connected to the second node F. The charge transistors $TL1_T$ and $TL1_F$ are designed to maintain a charge necessary to set up a given logical level, for example a level '1', for example corresponding to a potential equal to the power supply potential VDD on either of the nodes T or F, as a function of the logical value memorised in the cell 300. The first cell 300 is also provided with a first asymmetric double-gate access transistor $TA1_T$ and a second asymmetric double-gate access transistor $TA1_F$. The access transistors $TA1_T$, $TA1_F$ may for example be of the NMOS type. The first access transistor $TA1_T$ and the second access transistor $TA1_F$ each comprises a first gate connected to a first word line WL. The second gate of the first access transistor $TA1_T$ is connected to the first storage node T, while the second gate of the second access transistor $TA1_F$ is connected to the second storage node F. The source of the first access transistor $TA1_T$ is connected to a first bit line $BL_T$, while the source of the second access transistor $TA1_F$ is connected to a second bit line $BL_F$. The drain of the first access transistor $TA1_T$ is connected to the first storage node T, while the drain of the second access transistor $TA1_F$ is connected to the second storage node F. The access transistors $TA1_T$, $TA1_F$ are arranged to allow access to storage nodes T and F, during a read or write phase of cell 300, and to block access to cell 300 when the cell 300 is in an information retention mode. Such a cell 300 can give an improved margin against static noise and an improved compromise between stability in retention and stability in reading. In this example, the information stored in retention is also maintained without making use of refreshment means. The word line WL is controlled as a function of the mode in which it is required to place the cell 300.

The following describes an example operation of such a cell 300:

In retention mode, bit lines $BL_T$, $BL_F$ are connected to a potential VSS while the word line WL is also kept at potential VSS to stabilise a memorised data. Access transistors $TA1_T$ and $TA1_F$ are in a blocked state. In the case in which the first node T is at a high logical level and the second node F is at a low logical level, the second charge transistor $TL1_F$ is also blocked, and only the first charge transistor $TL1_T$ is conducting. The current passing through the second access transistor $TA1_F$ must be greater than the sum of the current passing through the second charge transistor $TL1_F$ and the gate current output from the first charge transistor $TL1_T$, to keep the potential of the second node F close to VSS. Connecting the second gate of the second access transistor $TA1_F$ to the first storage node T set to VDD, increases its leakage current for example by 2 to 3 decades and thus guarantees good stability in retention. The use of asymmetric double-gate architecture transistors can satisfy this condition, provided that the threshold voltage of the second access transistor $TA1_F$ is less than the threshold voltage of the second charge transistor $TL1_F$, taking account of polarisation conditions.

In read mode, the bit lines are initially charged or precharged to a potential VSS. The word line is then polarised at a potential VDD selected so as to enable access to storage nodes T, F. The stability of the cell 300 in read mode depends on the relation between conduction currents of transistors $TL1_T$ and $TA1_T$. The conduction current that passes through the first access transistor $TA1_T$ is made less than the conduction current of the first charge transistor TL1T, to maximise the margin against noise. The connection of the second gate of the first access transistor $TA1_T$ to the storage node F at zero voltage limits the current in the conducting state of the first access transistor $TA1_T$ and thus guarantees good stability of the cell 300 in read. This condition can be satisfied by using double-gate architecture transistors because, taking account of polarisation conditions in read mode, the first access transistor $TA1_T$ will have one channel while the second charge transistor $TL1_T$ will have two channels.

In write mode, for example to write a logical value '0' on the first node T such that T=0, and F=1, the second bit line $BL_F$ is initially charged or precharged to a potential VDD while the first bit line BLT is kept at a potential VSS. The word line WL is then polarised at potential VDD to activate access transistors $TA1_T$ and $TA1_F$ so as to connect the storage nodes to the bit lines.

Figure 8:
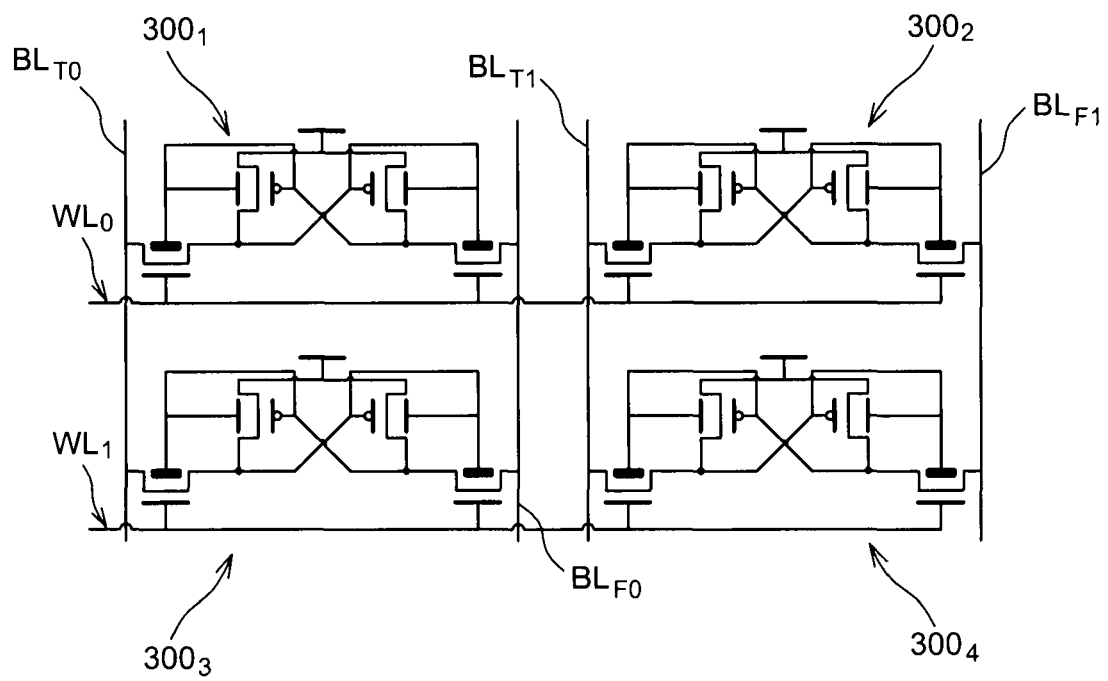
FIG. 8 shows a portion of an example memory matrix provided with cells of the type shown in FIG. 7.

The memory cell 300 that has just been described may be integrated into a memory matrix as shown in FIG. 8. This FIG. 4 shows cells $300_1$, $300_2$, $300_3$, $300_4$ of a memory matrix among N cells (where N>0) of the same type as cell 300. The memory matrix is formed from p columns, each column comprising m cells of the same type as cell 300. In this example, each of the columns in the matrix comprises two bit lines $BLT_0$, $BLF_0$, $BLT_1$, $BLF_1$, . . . , and is controlled by a column decoder. The m*p memory cells are controlled by m word lines $WL_0$, $WL_1$, . . . .

Figure 9:
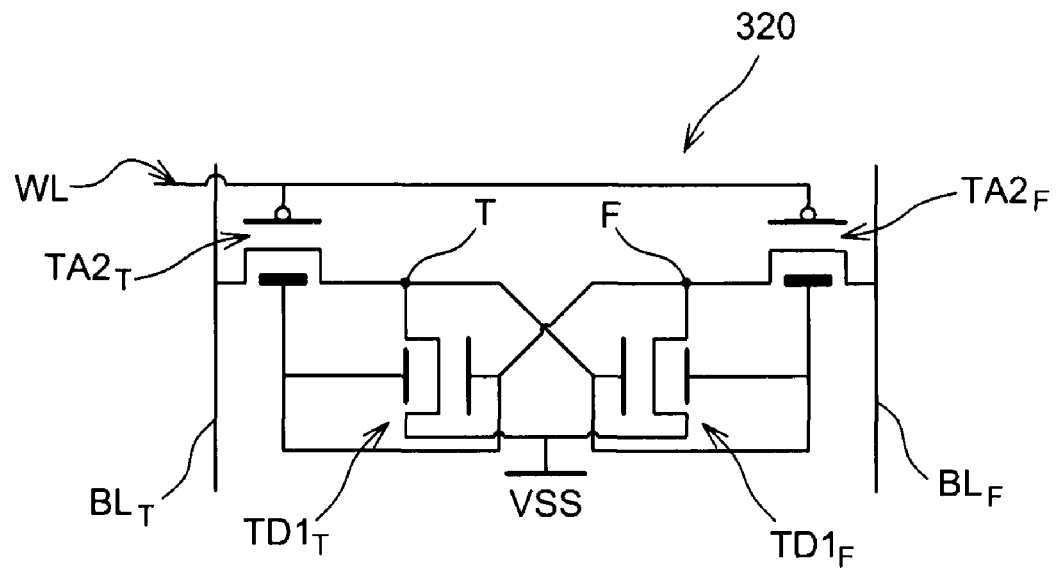
FIG. 9 shows another example of a 4T memory cell made using a technology complementary to that used for the cell in FIG. 7.

FIG. 9 shows a second example of a cell 320 with four transistors complementary to the first cell 300 described above. Such a cell 320 may also be made using a process according to the invention. In this example charge transistors are replaced by conduction transistors TD1T, TD1F, for example asymmetric double-gate NMOS transistors. The conduction transistors TD1T, TD1F are connected at VSS. The cell 320 is also provided with access transistors $TA2_T$, $TA2_F$ made using a technology complementary to the technology used for the access transistors in the first cell 300, and may for example be of the PMOS type.

According to one variant embodiment, a memorised data refreshment device may be associated with the cell in a case in which it is required to give priority to stability of the cell in read mode. The cell then behaves dynamically.

The stability of the cell in read mode can be improved without deteriorating the stability in retention, by reducing the potential of the word line WL activated in read.

It is also possible to co-integrate asymmetric and symmetric transistors using a process for example of the type described above with reference to FIGS. 5A-5B, in order to improve the global stability of the memory cell.

Figure 10:
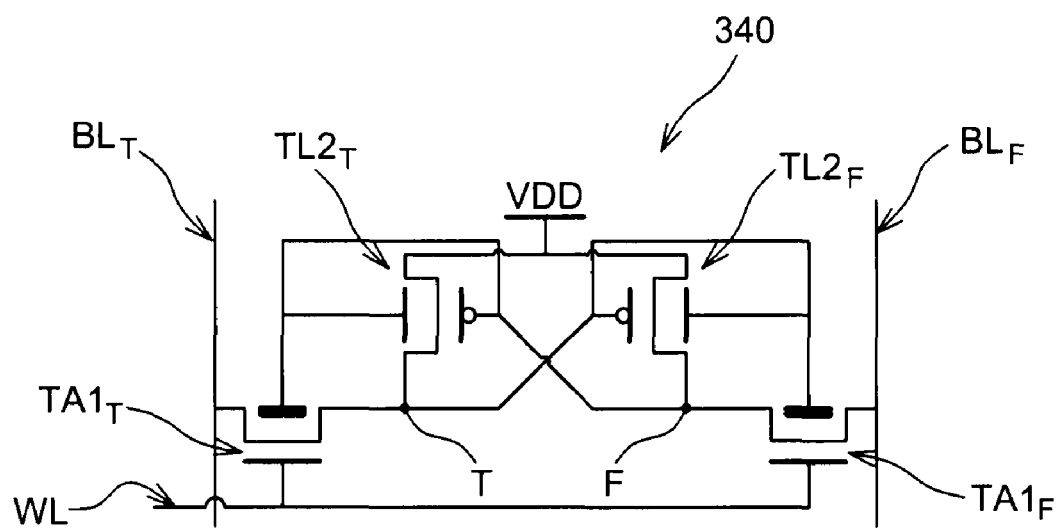
FIG. 10 shows another example of a 4T memory cell provided with 2 asymmetric double-gate transistors and 2 asymmetric double-gate transistors co-integrated on the same substrate.

FIG. 10 shows a third example of an SRAM cell 340 with 4 transistors implemented using a process according to the invention. This third cell 340 is different from the first cell 300 in that it comprises a first symmetric double-gate charge transistor $TL2_T$, and a second charge transistor $TL2_F$, also a symmetric double gate transistor. Symmetric double-gate and asymmetric double-gate transistors are thus co-integrated into the same memory cell. This improvement can increase the ratio between the current in the conducting state and the current in the blocked state $I_{ON}/I_{OFF}$ of the charge transistors. The quantity of charge to be evacuated in the bit line $BL_T$ through the access transistor $TA1_F$ becomes smaller in retention mode, and the discharge from node T in read mode is more strongly compensated by the first charge transistor $TL1_T$.

Figure 11A:
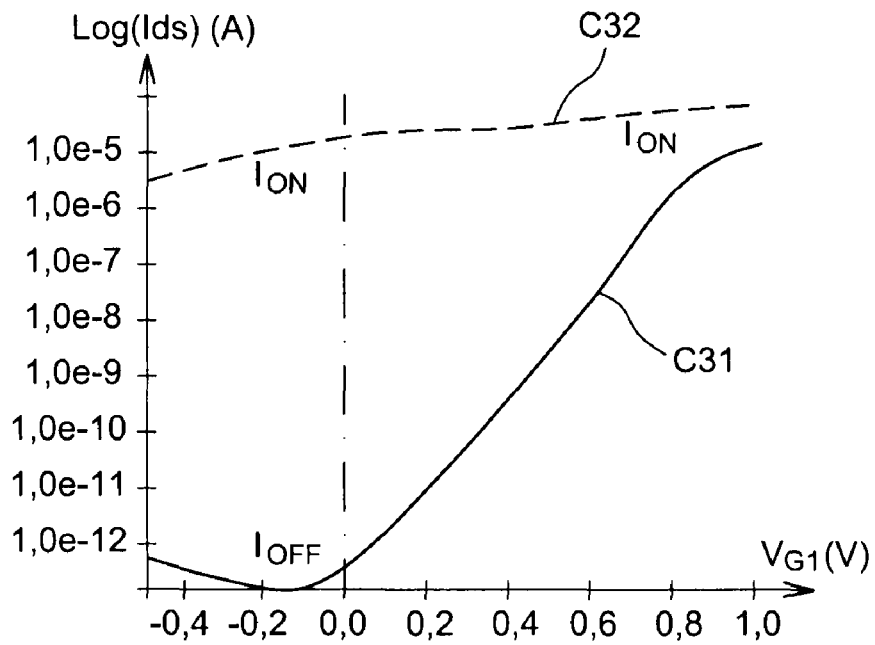
FIG. 11A shows an example of how the channel current of a double-gate transistor varies as a function of the polarisation of its two gates.

FIG. 11A shows the electrical characteristics of a symmetric double-gate transistor. Two polarisation curves C31 and C32 are given in this figure. A first polarisation curve C31 is representative of the variation of the drain-source current Ids as a function of a potential Vg1 applied on a first gate of the transistor, when the second gate of the transistor is in a first polarisation state and a potential Vg2=0 Volts is applied on the second gate. A second polarisation curve C32 is representative of the variation of the drain-source current Ids as a function of a potential Vg1 applied on the first gate of the transistor when the second gate of the transistor is in a third polarisation state and a potential Vg2=VDD is applied on the second gate, where VDD is a power supply potential of the cell.

An asymmetric double-gate is formed from two distinct gates dissymmetric about the principal plane of the semiconducting active zone on each side of which these gates are placed. In a transistor provided with an asymmetric double-gate, the current output between the drain and the source of the transistor is different depending on whether the first gate or the second gate is active, even for the same polarisation.

Figure 11B:
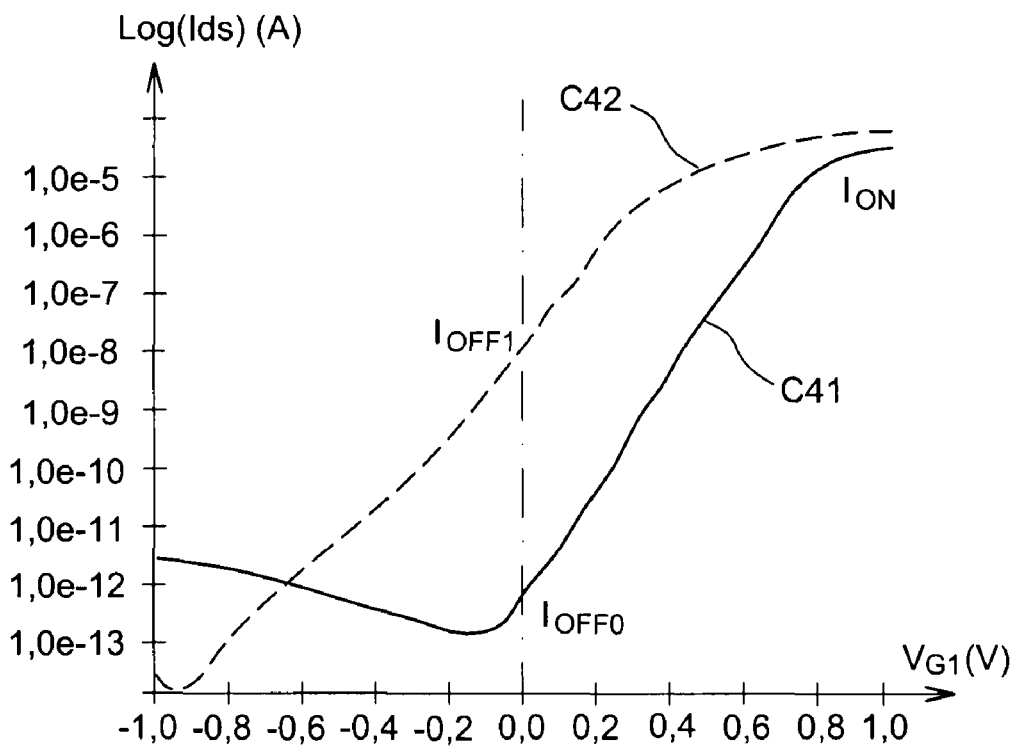
FIG. 11B shows an example of how the channel current of an asymmetric double-gate transistor varies as a function of the polarisation of its two gates.

FIG. 11B shows an example of the electrical characteristics of an asymmetric double-gate transistor implemented in a memory cell according to the invention. In this figure, the curves $C_{41}$, $C_{42}$ are representative of the change in the current passing through the active zone between the drain and the source as a function of a potential $V_{G1}$ applied on the first gate for different fixed values of a potential $V_{G2}$ applied on the second gate. The curve $C_{41}$ is given for a first potential value $V_{G2}$ which in this example is equal to 0 volts, while the curve $C_{42}$ is given for a second potential value $V_{G2}$ which in this example is 1 volt. In this example the second gate will not allow the transistor to output a current $I_{ON}$ if it is active. This example of a transistor is characterised by two currents $I_{ON}$ in the conducting state for a potential applied on the first gate $V_{G1}$=VDD and a potential applied on the second gate $V_{G1}$ such that $V_{G1}$=$V_{G2}$=VDD and two currents $I_{OFF}$ in the blocked state for $V_{G1}$=0V depending on whether $V_{G2}$=0V or VDD).

Figure 12:
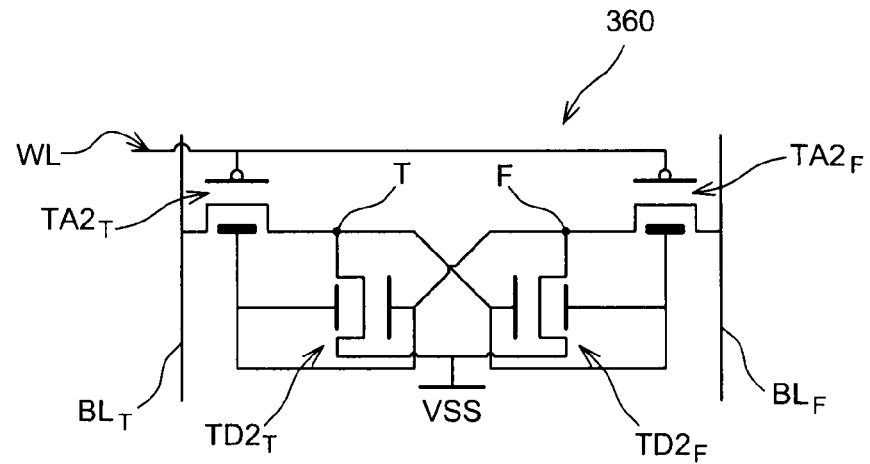
FIG. 12 shows another example of a 4T memory cell made using a technology complementary to that used for the cell in FIG. 11.

FIG. 12 shows a fourth example of an SRAM cell 360 with 4 transistors implemented using a process according to the invention. This fourth example cell 360 is different from the second example in that the cell 360 comprises a first double-gate conduction transistor $TD2_T$, in this case symmetric, and a second conduction transistor $TD2_F$ also a symmetric double-gate transistor.

We will now give comparative examples of the performances of the cell 300 described above relative to the performances of a cell with 6 transistors called a "standard 6T" implemented according to prior art. These comparative results were obtained for a 32 nm critical gate dimension technology. The compared cells were sized such that they have approximately the same read current ICELL. The cell 300 can give a much greater static noise margin (SNM) and write noise margin RNM than the static noise margin of the standard 6T cell. The SNM for the 4T cell is more than 40% better than the 6T cell, and its write margin is more than 50% better for an increase in the surface area of the order of 41%. The leakage currents are also less than 28%.

Figure 13:
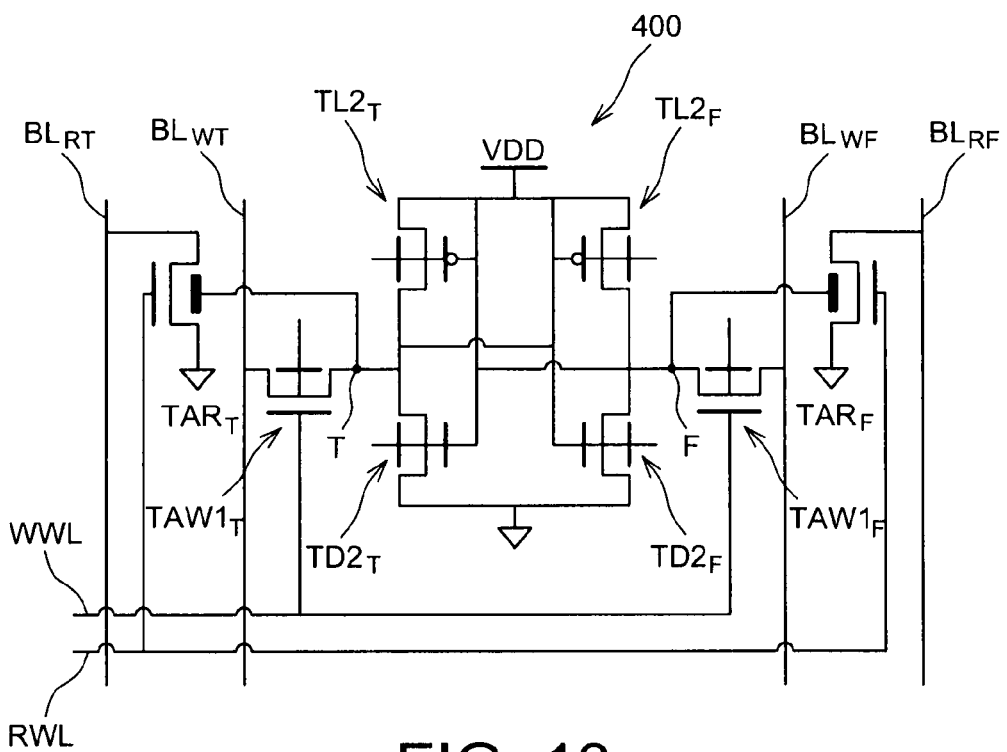
FIG. 13 shows an example of an 8T memory cell provided with 8 double-gate transistors including four asymmetric double-gate transistors and four symmetric double-gate transistors co-integrated on the same substrate.

FIG. 13 shows another example of a random access memory cell provided with 8 double-gate transistors including several asymmetric double-gate transistors and several symmetric double-gate transistors implemented using a process according to the invention.

This cell reference 400 called "8T" is provided with four asymmetric double-gate access transistors, two charge transistors and two symmetric double-gate conduction transistors. The first access transistor and the second access transistor in this case are referenced $TAW1_T$ and $TAW1_F$ respectively, while the first bit line, the second bit line are referenced $BL_{WT}$ and $BL_{WF}$ respectively. The cell 400 comprises a word line WWL connected to the first gate of the first and second access transistors $TAW1_T$ and $TAW1_F$, and is also provided with a second word line RWL and two other bit lines $BL_{RT}$ and $BL_{RF}$. The cell 400, also comprises a third asymmetric double-gate access transistor $TAR1_T$, and a fourth asymmetric double-gate access transistor $TAR1_F$, for example made using the NMOS technology. The first gate of the third access transistor $TAR1_T$ and the first gate of the fourth access transistor $TAR1_F$ are connected to the second word line RWL. The second gate of the third access transistor $TAR1_T$ is connected to the first storage node T, while the second gate of the fourth access transistor $TAR1_F$ is connected to the second storage node F. The second word line RWL, the third and fourth bit lines $BL_{RT}$ and $BL_{RF}$ and the third and fourth access transistors $TAR1_T$, $TAR1_F$, are dedicated to read operations of the cell 400. The first word line WWL, the bit lines $BL_{RT}$, $BL_{RF}$, WBLT, WBLF and the first access transistor $TAW1_T$, and second access transistor $TAW1_F$ are dedicated to write operations. The cell 400 also comprises an additional conduction transistor $TDR1_T$ connected between the third access transistor and the ground, and another additional transistor $TDR1_F$ connected between the fourth access transistor and the ground.

DOCUMENTS CITED

[ILL05]: Article by G. Illicali et al, Planar Double Gate Transistors with Asymmetric Independent Gates, SOI Conference (2005). p. 126.

[DEL01]: WO 03/021633A1.

[KED01]: Article by J. Kedziersky et al, High-performance symmetric-gate and CMOS-compatible V, asymmetric-gate FinFET devices, page 19.5.1, IEDM 2001.

[LU05]: Article by C H Lu, Characteristics and Mechanism of Tunable Work Function Gate Electrodes Using a Bilayer Metal Structure on $SiO_2$ and $HfO_2$, EDL vol. 26 (7), p. 445 (2005).

[MAT05]: Article by L. Mathew, Multiple Independent Gate Field Effect Transistor (MIGFET), VLSI 2005, page 200.

The invention claimed is:

1. A method for fabricating a microelectronic device with one or plural double-gate transistors, comprising:
    a) forming one or plural structures on a substrate including at least a first block configured to form a first gate of a double-gate transistor, and at least a second block configured to form a second gate of the double-gate, the first block and the second block being located on opposite sides of at least one semiconducting zone and separated from the semiconducting zone by a first gate dielectric zone and a second gate dielectric zone respectively; and
    b) doping at least one or plural semiconducting zones in the second block of at least one given structure among the structures, using at least a first implantation selective relative to the first block, the second block being covered by a hard mask, a critical dimension of the hard mask being larger than the critical dimension of the second block.

2. A method according to claim 1, in which the first implantation is done at a non zero predetermined angle from a normal to the principal plane of the substrate passing through the semiconducting zone.

3. A method according to claim 1, in which the first implantation is done in zones in the second block located close to and/or in contact with the second dielectric zone.

4. A method according to claim 1, in which the first implantation is done on a first side of the given structure, the part of the structure on the other side of a normal to the principal plane of the substrate passing through the semiconducting zone not being implanted.

5. A method according to claim 1, further comprising at least one selective etching c) between non-implanted semiconducting zones of blocks and implanted semi-conducting zones of the second block after the doping b).

6. A method according to claim 5, in which the selective etching is selective between non-doped semiconducting zones and semiconducting zones doped using the implantation.

7. A method according to claim 5, in which the selective etching is selective between semiconducting zones doped using a given type of doping and semiconducting zones doped by the implantation using another type of doping different from the given type of doping.

8. A method according to claim 1, in which the first block is supported on the substrate, the first block, the semiconducting zone and the second block being superposed on top of the substrate.

9. A method according to claim 8, in which the structures in the forming a) are made such that the critical dimension of the first block and the second block is less than the critical dimension of an second and/or an first isolating zone.

10. A method according to claim 1, the first block and/or the second block being semiconductors.

11. A method according to claim 1, the first block and/or the second block being formed from at least one metallic layer and at least one stacked semiconducting layer respectively.

12. A method according to claim 1, the given structure configured for an asymmetric double-gate transistor.

13. A method according to claim 1, in which at least one particular structure among the structures formed in the forming a) is protected during the doping done in the doping b), by at least one protection layer, the particular structure configured for a symmetric double-gate transistor.

14. A method for fabricating a random access memory cell provided with asymmetric double-gate transistors comprising a method according to claim 1.

15. A method for fabricating a random access memory cell structure provided with asymmetric double-gate transistors and symmetric double-gate transistors using a method according to claim 14.

16. A method according to claim 15, the memory being a static random access memory SRAM.

* * * * *